United States Patent [19]

Shimada et al.

[11] Patent Number: 5,923,535

[45] Date of Patent: Jul. 13, 1999

[54] ELECTRONIC DEVICE ASSEMBLY

[75] Inventors: Yuzo Shimada; Takayuki Suyama; Shinichi Hasegawa, all of Tokyo, Japan

[73] Assignee: NEC Corporation, Tokyo, Japan

[21] Appl. No.: 08/959,270

[22] Filed: Oct. 28, 1997

Related U.S. Application Data

[63] Continuation of application No. 08/515,589, Aug. 16, 1995, abandoned.

[30] Foreign Application Priority Data

Aug. 31, 1994 [JP] Japan ............................ 6-206431
Sep. 30, 1994 [JP] Japan ............................ 6-236531

[51] Int. Cl.⁶ .................... H05K 1/03; H05K 1/14
[52] U.S. Cl. .................. 361/749; 174/250; 174/254; 257/737; 257/738; 361/767; 361/760; 361/779
[58] Field of Search ............................ 174/250, 252, 174/253, 254, 255, 259, 260, 262, 263, 264, 265, 266, 268; 156/252, 264; 228/180.21, 180.22; 257/690, 692, 698, 700, 701, 707, 723, 724, 735, 737, 738, 773, 774, 778, 780; 361/749, 750, 752, 753, 760, 761, 764, 768, 770, 771, 772, 773, 774, 775, 776, 779, 783

[56] References Cited

U.S. PATENT DOCUMENTS

| | | | |
|---|---|---|---|
| 5,045,921 | 9/1991 | Lin et al. ............................ | 257/738 |
| 5,051,811 | 9/1991 | Williams et al. . | |
| 5,203,075 | 4/1993 | Angulas et al. . | |
| 5,435,732 | 7/1995 | Angulas et al. ............................ | 439/67 |
| 5,519,936 | 5/1996 | Andros et al. ............................ | 257/738 |
| 5,773,884 | 6/1998 | Andros et al. ............................ | 257/737 |
| 5,796,170 | 8/1998 | Marcantonio ............................ | 257/780 |

FOREIGN PATENT DOCUMENTS

| | | |
|---|---|---|
| 6 334 936 | 2/1988 | Japan . |
| 1 307 236 | 12/1989 | Japan . |
| 3 252 192 | 11/1991 | Japan . |
| 5 82664 | 4/1993 | Japan . |
| 5 144 995 | 6/1993 | Japan . |

OTHER PUBLICATIONS

S. Kayama et al.; "VLSI Packaging Technology", 1993, Nikkei BP, Tokyo, Japan pp. 1–5 and 157–185.

IBM Technical Disclosure Bulletin "Photoformed Chip Carrier" vol. 28, No. 7, dated Dec. 1985.

IBM Tecnical Disclosure Bulletin "Flip–Chip Carrier Assembly For Improved Thermal Performance" vol. 37, No. 07 pp. 207 and 209, dated Sep. 1994.

*Primary Examiner*—Donald Sparks
*Attorney, Agent, or Firm*—McGinn & Gibb, P.C.

[57] ABSTRACT

An electronic device assembly includes a rigid, first substrate and a second substrate. The first substrate has a first pad on the upper surface, and a through-hole at a position of the first pad. The second substrate has a second pad on the upper surface thereof. The first and second pads are connected via solder. At least a part of the solder is positioned in the through-hole of the first substrate. The first substrate may include a flexible substrate and a rigid plate. The through-hole is provided in the flexible substrate. The first pad is provided on the lower surface of the flexible substrate. The rigid plate is attached to the flexible substrate. The plate has a hole at a position of the through-hole to make the first pad reachable.

3 Claims, 6 Drawing Sheets

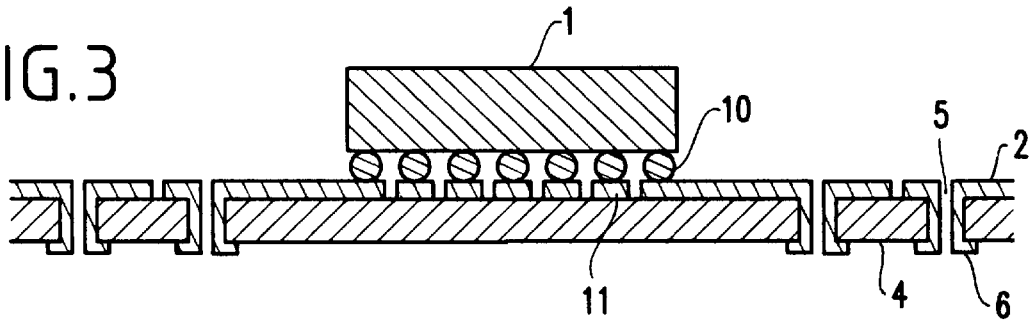
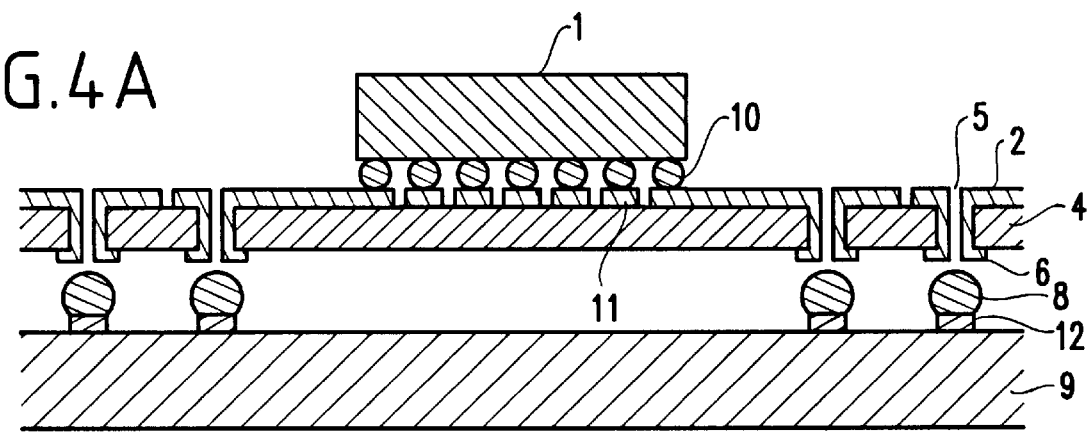
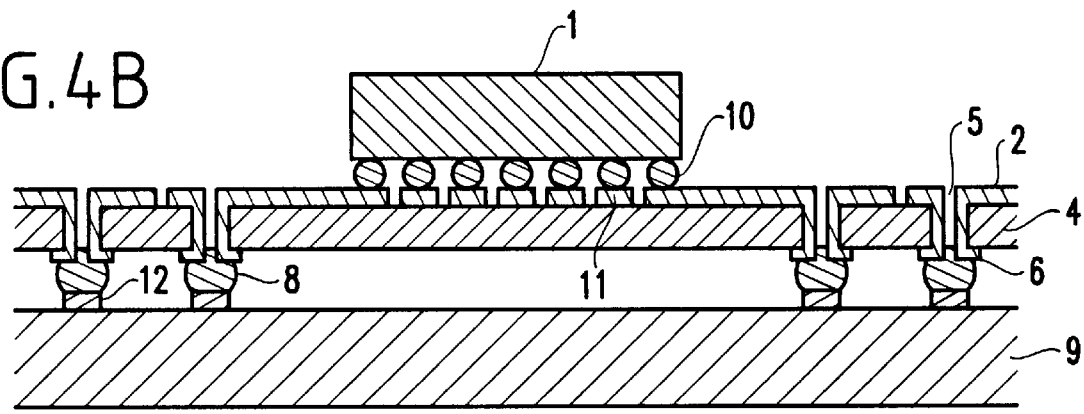
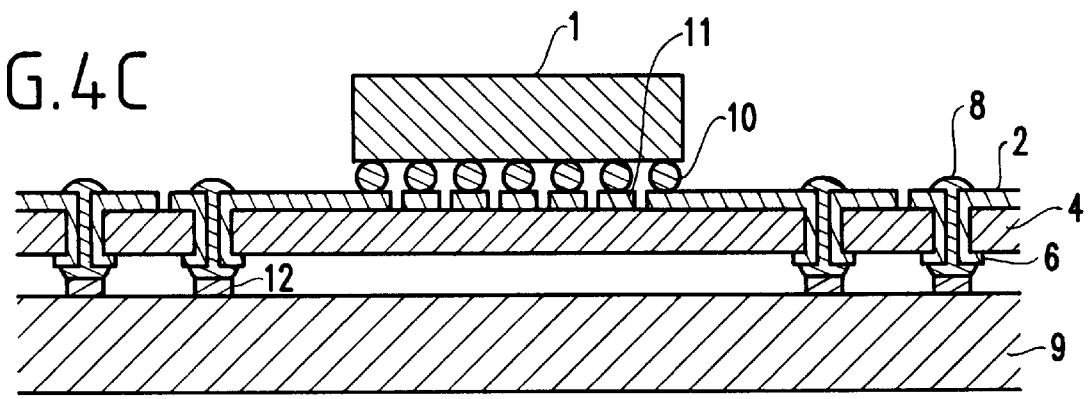

ELECTRONIC DEVICE ASSEMBLY

This is a continuation of application Ser. No. 08/515,589 filed Aug. 16, 1995 now abandoned.

BACKGROUND OF THE INVENTION

The present invention relates to an electronic device assembly, and more particularly to an electronic device assembly including a first substrate on which an electronic device is mounted and a second substrate on which the first substrate is mounted.

An example of a conventional electronic device is disclosed in U.S. Pat. No. 5,203,075.

Referring to FIG. 10 of the above reference, a semiconductor device 43 is mounted on a flexible substrate 31. The flexible substrate 31 is connected to a substrate 13 via solder.

Referring to FIGS. 6 and 9 of the reference, a solder member 32 and a solder paste 27 connects the flexible substrate 31 and the substrate 13. Part of the solder member 32 is positioned in a through-hole provided in the flexible substrate 31.

In a process of connecting the flexible substrate 31 and the substrate 13, the flexible substrate 31 should be kept flat and parallel to the substrate 13. When the flexible substrate 31 warps or deforms, the respective heights of the bumps (i.e., the gap between a conductor 39 and a conductive pad 23) vary with the positions thereof to reduce the reliability of the connection between the flexible substrate 31 and the substrate 13.

Referring again to FIG. 10 of the above reference, the flexible substrate 31 is stretched across frame member 47 to maintain the flexible substrate 31 substantially parallel to the substrate 13. The frame member 47 serves to position the flexible substrate 31 at a desired distance from the substrate 13.

However, this conventional structure has the following problems.

First, the conventional structure requires the frame member 47. Second, the manufacturing process of this conventional structure requires a step of attaching the frame member to the substrate 13 and a step of stretching the flexible substrate 31 across the frame member 47.

SUMMARY OF THE INVENTION

In view of the foregoing problems of the conventional structure, one object of the present invention is to provide an electronic device assembly in which a carrier substrate (e.g., a flexible substrate) is maintained flat without a frame member being necessary.

Another object of the present invention is to enhance the evenness (e.g., flatness) of a carrier substrate.

Yet another object of the present invention is to improve the reliability of a connection between a carrier substrate and a mounting substrate (e.g., a relatively rigid substrate).

Yet another object of the present invention is to provide an electronic device assembly in which a connection failure can easily be detected.

According to the present invention, an electronic device assembly includes a rigid first substrate and a second substrate. The first substrate has a first surface, a second surface, a first pad on the second surface, and a through-hole at a position of the first pad. The second substrate has a first surface, a second surface, and a second pad on the first surface thereof. The first surface of the second substrate faces the second surface of the first substrate. The first and second pads are connected via solder. At least a part of the solder is positioned in the through-hole of the first substrate.

The first substrate may include a ceramic sheet.

The first substrate may include a flexible substrate and a rigid plate. The flexible substrate has a first surface, and a second surface. The through-hole is provided in the flexible substrate. The first pad is provided on the second surface of the flexible substrate. The rigid plate is attached to the flexible substrate. The plate has a hole at a position of the through-hole.

The rigid plate may include a metal plate coated with an insulating material.

The through-hole may be tapered.

The distance between the first and second substrates may be adjusted by providing a core in the solder and providing the core with a predetermined diameter.

BRIEF DESCRIPTION OF THE DRAWINGS

Other objects, features and advantages of the present invention will become more apparent when the following description is read in conjunction with the accompanying drawings, wherein:

FIG. 3 shows the structure of an electronic device assembly according to a second embodiment of the present invention.

FIGS. 4(A) to 4(C) illustrate the steps of a process for mounting the electronic device assembly shown in FIG. 1 on a substrate.

In these drawings, the same reference numerals depict the same parts, respectively.

DETAILED DESCRIPTION OF THE PREFERRED EMBODIMENTS

Next is described a first embodiment of the present invention.

Figure 1:
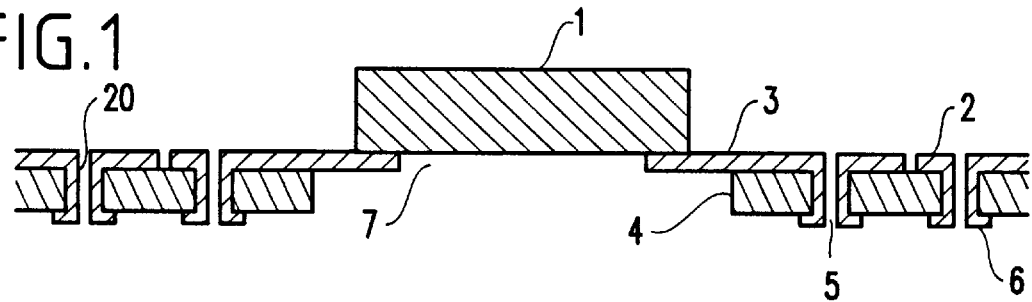
FIG. 1 shows the structure of an electronic device assembly according to a first embodiment of the present invention.

Referring to FIG. 1, an electronic device assembly according to a first embodiment of the present invention includes a carrier substrate (e.g., ceramic sheet 4) and an electronic device (e.g., LSI chip 1) mounted on the ceramic sheet 1.

In the exemplary embodiment, the LSI chip 1 is square-shaped having a length of approximately 17.5 mm. The LSI chip 1 has 800 terminals along each of the sides thereof. The terminals are aligned with approximately an 80 µm pitch.

The ceramic sheet 4 is formed from a rigid insulating material or a composite of such materials. Specifically, the material is preferably a borosilicate-lead-type glass ceramic. The material may be other glass ceramics such as steatite-type, forsterite-type, cordierite-type, and mooreite-type ceramics. Ceramics such as alumina-type, zirconium-type, and silica-type ceramics can also be used.

In the exemplary embodiment, the ceramic sheet 4 is square-shaped having a length of approximately 43 mm. The thickness of the ceramic sheet 4 is about 200 µm. Considering the flowing up of solder described below, the thickness of the ceramic sheet 4 is set within the range of 200 µm to 1000 µm. The warpage or deformation of the ceramic sheet 4 is preferably less than 20 µm.

Unlike prior ceramic substrates, ceramic sheet 4 does not have a conductive layer therein.

The ceramic sheet 4 has a device hole 7 in the center thereof. The device hole is square-shaped having a length of approximately 18.2 mm.

A conductive pattern 2 and pad 6 are formed on the upper and lower surfaces of the ceramic sheet 4, respectively. The conductive pattern 2 and the pad 6 are formed from copper having a thickness of about 10 µm to 20 µm. The pad 6 is annular and has an outer diameter of about 400 µm. The pad 6 is plated with gold having a thickness of about 1 µm to 5 µm.

The ceramic sheet 4 has a through-hole 5 having a diameter of approximately 200 µm. A conductive pattern 20 is formed on the inner surface of the through-hole 5. The conductive pattern 20 connects the pad 6 and the conductive pattern 2.

An inner lead 3 is provided on the upper surface of the ceramic sheet 4. One end of the inner lead is connected to the conductive pattern 2. Another end of the inner lead protrudes above the device hole and is connected to the terminals of the LSI chip 1. When the inner lead 3 and the LSI chip 1 are connected, a thermode (unillustrated) is inserted in the device hole 7.

Next is described the structure of the electronic device assembly further including a mounting substrate.

Figure 2A:
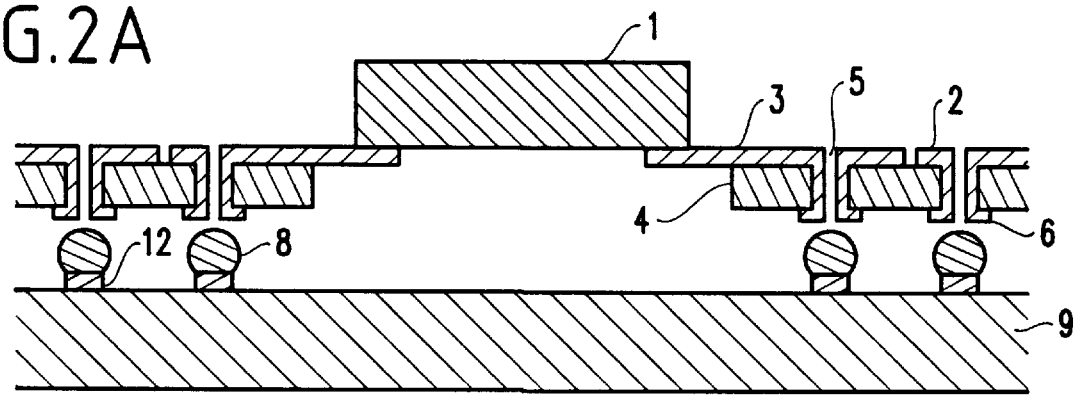
FIGS. 2(A) to 2(C) illustrate the steps of a process for mounting the electronic device assembly shown in FIG. 1 on a substrate.
Figure 2B:
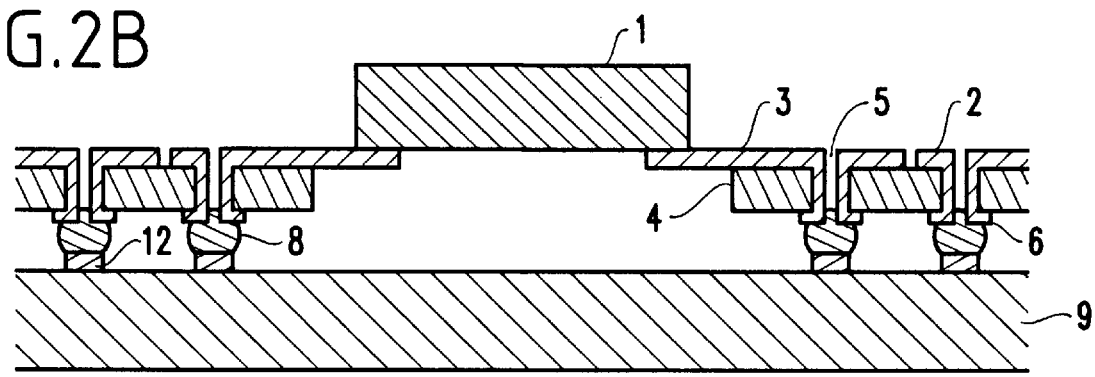
Figure 2C:
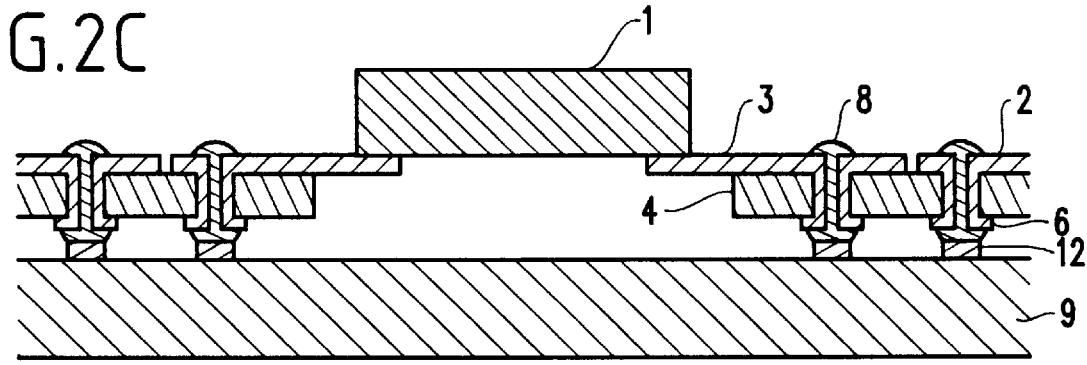

Referring to FIG. 2(C), pad 12 is formed on the upper surface of a mounting substrate 9. The pad 12 is circular-shaped having a diameter of 600 µm. Solder 8 connects the pad 12 of the mounting substrate 9 and the pad 6 of the ceramic sheet 4. Part of the solder 8 is placed in the through-hole 5 of the ceramic sheet 4. A portion of the solder 8 appears on the upper surface of the ceramic sheet 4.

The mounting substrate 9 may be a glass-epoxy substrate or a ceramic substrate. The mounting substrate 9 may include a conductive layer therein.

Next is described a process for connecting the ceramic sheet 4 to the mounting substrate 9.

Referring to FIG. 2(A), in a first step, solder 8 is provided on the pad 12 (e.g., by a screen printing). The volume of the solder 8 is about $3 \times 10^{-11}$ m$^3$. Preferable materials for the solder 8 include tin/lead, tin/lead/antimony, tin/lead/cadmium, and tin/lead/indium. In this exemplary embodiment, tin/lead solder was used.

Referring to FIG. 2(B), in a second step, the ceramic sheet 4 is positioned so that the pad 6 faces the solder 8. The LSI chip 1 is mounted on the ceramic sheet 4 previously (in advance).

Referring to FIG. 2(C), in a third step the solder 8 is heated to a temperature in a range from about 200° C. to 250° C. by reflowing. The solder 8 melts to connect the pads 6 and 12. Part of the solder 8 flows into the through-hole 5 and a portion of the solder 8 appears on the upper surface of the ceramic sheet 4. A connection failure of the solder 8 can be determined by confirming whether a portion of the solder 8 appears on the upper surface of the ceramic sheet 4. Specifically, if a portion of the solder 8 appears on the upper surface of the ceramic sheet 4, the connection is normal.

In the third step, the ceramic sheet 4 is rigid and does not warp or deform. The ceramic sheet 4 maintains a substantially flat contour and is substantially parallel to the mounting substrate 9. Thus, uniform gaps are provided between the pad 6 and pad 12 across the entire ceramic sheet 4.

In the first step, solder may be provided on the pad 6 as well as on the pad 12. The material of the solder on the pad 12 also may be different from that of the solder 8.

Next is described the technical advantage of the first embodiment.

First, special attention (e.g., the frame member) and special handling are unnecessary to maintain the ceramic sheet flat because the ceramic sheet 4 is relatively rigid and does not deform.

Second, connection failure can easily be detected by confirming whether the solder 8 appears on the upper surface of the ceramic sheet 4.

Next is described a second embodiment of the present invention.

Referring to FIG. 3, the feature of the second embodiment is the structure of the ceramic sheet 4 and the connecting portion between the LSI chip 1 and the ceramic sheet 4. Other structures and functions are the same as those of the first embodiment.

The ceramic sheet 4 of the second embodiment does not have device hole 7 nor inner lead 3. Instead, the ceramic sheet 4 has pads 11 provided in the center of the upper surface thereof. Other structures and the materials of the ceramic sheet 4 are the same as those of the first embodiment.

The LSI chip 1 has terminals on the lower surface thereof. The LSI 1 is mounted on the ceramic sheet 4 in a "face-down" position and the terminals thereof are connected to the pads 11 via solder bumps 10.

Next is described a process for connecting the ceramic sheet 4 to the mounting substrate 9.

Referring to FIGS. 4(A) to 4(C), the ceramic sheet 4 of the second embodiment is connected to the mounting substrate 9 by substantially the same process shown in FIGS. 2(A) to 2(C).

Next is described a third embodiment of the present invention. The feature of the present invention is the structure of the through-hole 5 and the other structures and functions are the same as those of the first embodiment.

Figure 5:
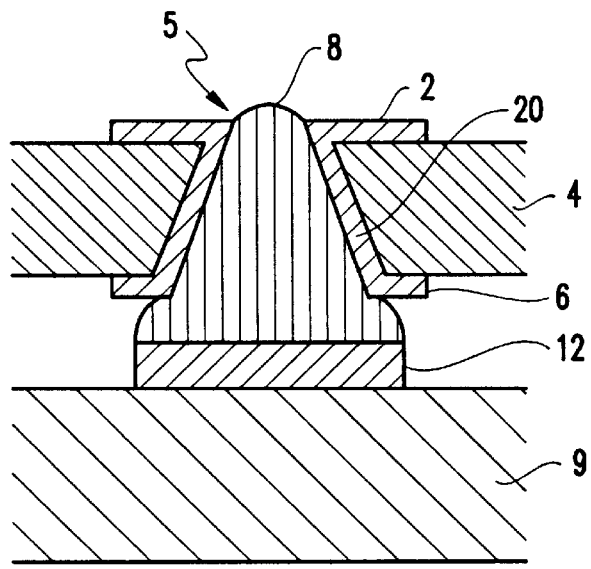
FIG. 5 shows the structure of an electronic device assembly according to a third embodiment of the present invention.

Referring to FIG. 5, the through-hole 5 of the third embodiment is tapered. The diameter of the through-hole 5 is about 200 µm and 400 µm at the upper and lower surfaces, respectively, of the ceramic sheet 4.

Next is described a fourth embodiment of the present invention. The feature of the fourth embodiment is a core 21 provided between the pads 6 and 12. The other structures and functions are the same as those of the third embodiment.

Figure 6:
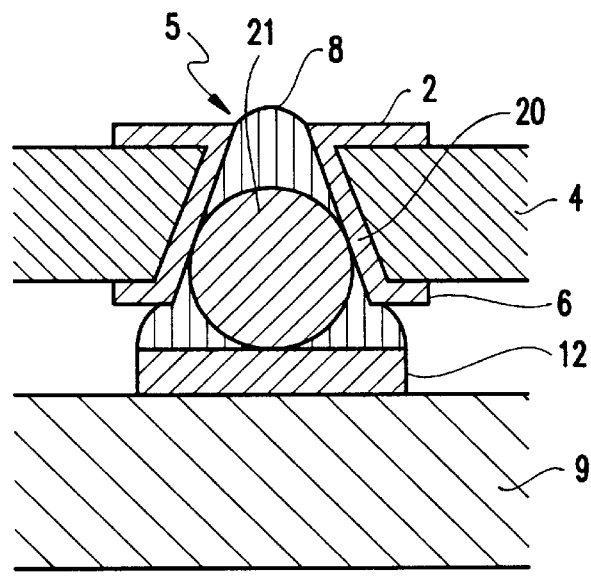
FIG. 6 shows the structure of an electronic device assembly according to a fourth embodiment of the present invention.

Referring to FIG. 6, a core 21 is provided between the pads 6 and 12. The melting point of the core 21 is higher than that of the solder 8 so that the core 21 does not melt in the heating step shown in FIG. 2(C). The core 21 is preferably formed from a metal or a ceramic. The upper portion of the core 21 is received in the through-hole 5. The distance between the pads 6 and 12 can be adjusted precisely due to the core 21 and specifically by varying its diameter.

Next is described a fifth embodiment of the present invention.

Figure 7:
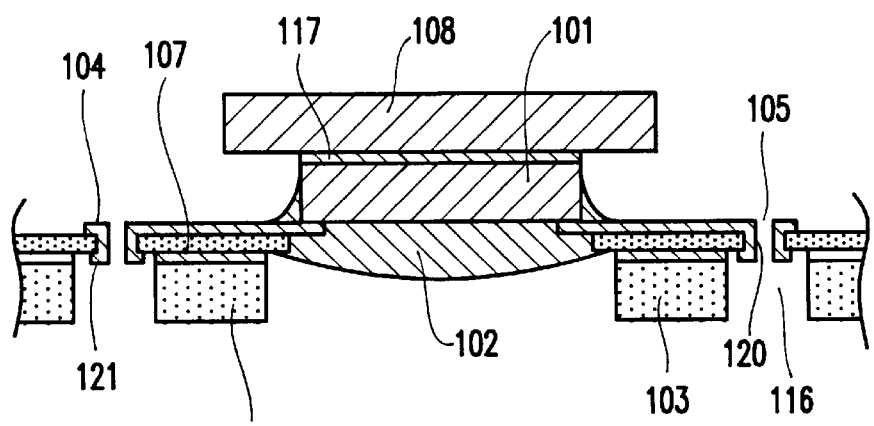
FIG. 7 shows the structure of an electronic device assembly according to a fifth embodiment of the present invention.
Figure 8:
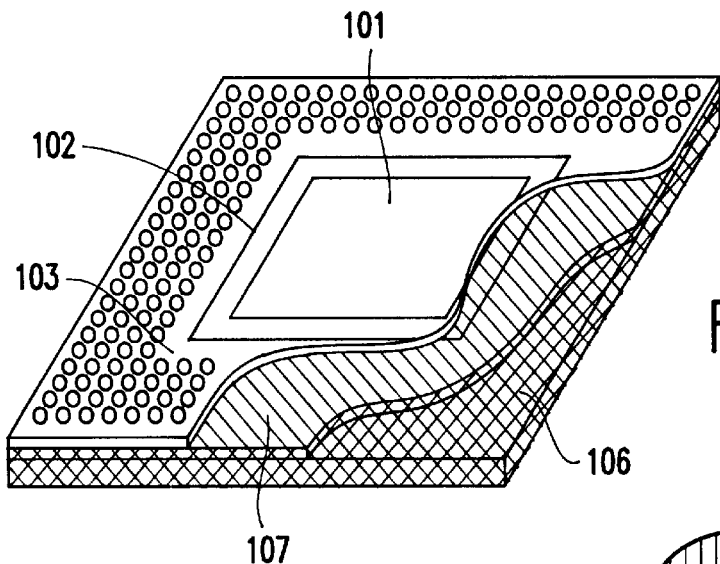
FIG. 8 shows the structure of an electronic device assembly according to a fifth embodiment of the present invention.

Referring to FIGS. 7 and 8, an electronic device according to the fifth embodiment includes an LSI chip 101, a heat radiating plate 108, a flexible substrate 103 on which the LSI chip 101 is mounted, and a plate 106 attached to the lower surface of the flexible substrate 103.

The LSI chip 101 has the same structure as that of the LSI chip 1 of the first embodiment. The terminals of the LSI chip 101 are connected to the inner leads of the flexible substrate 103. The connecting portion between the LSI chip 101 and the inner leads is encapsulated with a resin 102.

An adhesive 117 is applied to the upper surface of the LSI chip 101. The adhesive 117 attaches the heat radiating plate 108 to the LSI chip 101. The adhesive 117 preferably has high heat conductivity to effectively transfer heat from the LSI chip 101 to the heat radiating plate 108. For example, epoxy-type adhesive including silver powder or the like can be used as the adhesive 117.

A conductive pattern 104 is formed on the upper surface of the flexible substrate 103. The flexible substrate 103 has through-holes 105 having a diameter of approximately 150 $\mu$m. The through-holes 105 are disposed in an array with about a 1.27 mm pitch. A conductive pattern 120 is provided on the inner surface of the through-hole 105. Annular pad 121 is formed on the lower surface of the flexible substrate 103. The pad 121 surrounds the lower opening portion of the through-hole 105. The outer diameter of the pad 121 is about 400 $\mu$m.

The conductive pattern 104 includes an annular portion surrounding the upper opening portion of the through-hole 105 and a linear portion connecting the inner lead and the annular portion. The outer diameter of the annular portion of the conductive pattern 104 is about 250 $\mu$m. The width and thickness of the linear portion are about 40 $\mu$m and 25 $\mu$m, respectively.

The conductive pattern 104, the conductive pattern 120, and pad 121 are formed from copper plated with gold.

The flexible substrate 103 is formed from a material preferably easily attachable to the conductive pattern 104 and having suitable heat resistance and a relatively low thermal expansion coefficient. In this exemplary embodiment, a polyimide film having a thickness of approximately 50 $\mu$m is used as the flexible substrate 103. Other materials such as a fluorine-type film and an epoxy-type film can also be used.

The plate 106 serves as a stiffener to maintain the flexible substrate 103 flat. Therefore, the plate is preferably made from a rigid insulating material. In this exemplary embodiment, the plate 106 is an alumina ceramic plate having a thickness of about 200 $\mu$m. If the plate 106 has nearly the same thermal expansion coefficient as that of the flexible substrate 103, the warpage of the flexible substrate 103 in heating process can be reduced since the thermal expansion of these materials will be substantially the same. Polyimide and polyimide ethyl are exemplary materials having nearly the same thermal expansion coefficient as that of the flexible substrate 103.

The plate 106 has holes 116 at a position corresponding to the through-hole 105 of the flexible substrate 103. The diameter of the hole 116 is about 500 $\mu$m. The inner surface of the hole 116 may be plated with a suitable material according to the designer's requirement.

The plate 106 is attached to the lower surface of the flexible substrate 103 via an adhesive 107. The lower surface of the flexible substrate 103 is covered with the plate 106 except for the pad 121 which is reachable through the hole 116. The adhesive 107 preferably has suitable heat resistance, insulation, and anti-migration properties and may be the same adhesive as adhesive 117. In this exemplary embodiment, an epoxy-type adhesive is used as the adhesive 107.

Next is described a process for connecting the aforementioned electronic device assembly and a mounting substrate.

Figure 9A:
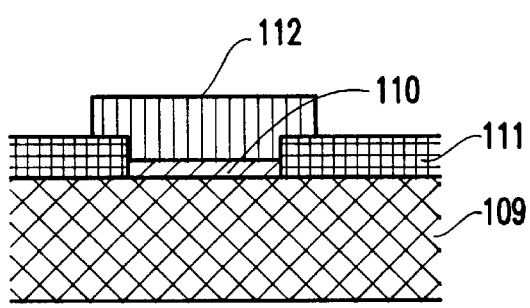
FIGS. 9(A) to 9(D) illustrate the steps of a process for mounting the electronic device assembly shown in FIG. 7 on a substrate.

Referring to FIG. 9(A), in this exemplary embodiment, the mounting substrate 109 is a glass-epoxy substrate. Pads 110 are provided on the upper surface of the mounting substrate 109. Each of pads 110 corresponds to one of the through-holes 105. The pads 110 are formed from copper. The pad 110 is circular-shaped having a diameter of 200 $\mu$m. The upper surface of the mounting substrate 109 is coated with a solder resist except for the pad 110.

Referring again to FIG. 9(a), in a first step, a solder paste 112 is provided on the pad 110. The solder paste 112 may also be provided in the area surrounding the pad 110.

Figure 9B:
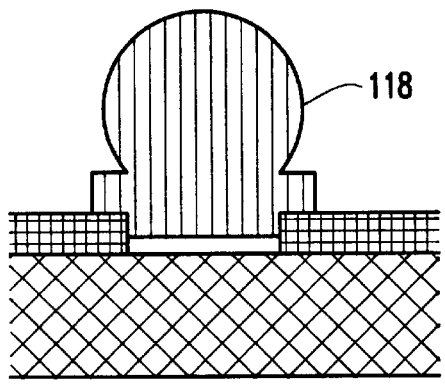

Referring to FIG. 9(b), in a second step, a spherical solder 118 is placed on the solder paste 112. The solder paste 112 and the solder 118 are heated to be connected together. Specifically, the solder paste 112 and the solder 118 are heated to a temperature in a range from about 200° C. to 250° C. for about 30 seconds to 1 minute. After the connection, the height of the solder 118 is higher than the thickness of the plate 106.

Figure 9C:
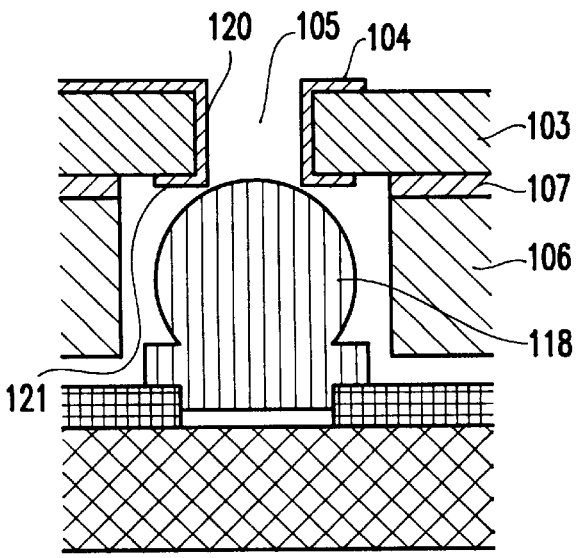

Referring to FIG. 9(C), in a third step, the flexible substrate 103 is positioned so that the pad 112 faces the corresponding solder 118.

Figure 9D:
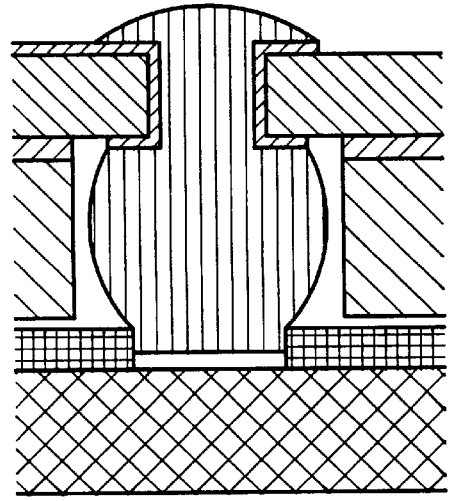

Referring to FIG. 9(D), in a fourth step, the solder paste 112 and the solder 118 are heated to about 200° C. to 250° C. for about 30 second to 1 minute. In this heating, the flexible substrate 103 may be pressed against the mounting substrate 109. The solder paste 112 and the solder 118 melt to connect the pads 110 and 112. Part of the solder 118 flows into the through-hole 105. A portion of the solder 118 appears on the upper surface of the flexible substrate 103.

Connection failure of the solder 118 can be determined by confirming whether a portion of the solder 118 appears on the upper surface of the flexible substrate 103 or not. Specifically, if the solder appears, the connection is normal.

In the fourth step, the flexible substrate 103 is maintained flat and parallel to the mounting substrate 109 because the flexible substrate 103 is supported by the plate 106. Thus, the gaps between the pads 121 and 110 become uniform across the entire flexible substrate 103.

Next is described the technical advantage of the fifth embodiment of the present invention.

First, special attention (e.g., the frame member) and special handling are unnecessary to maintain the flexible substrate 103 flat because the flexible substrate 103 is supported by the plate 106.

Second, connection failure can easily be detected by confirming whether the solder 118 appears on the upper surface of the flexible substrate 103.

Next is described a sixth embodiment of the present invention. The feature of the sixth embodiment is the position of the plate 106. The other structures and functions are the same as those of the fifth embodiment.

Figure 10:
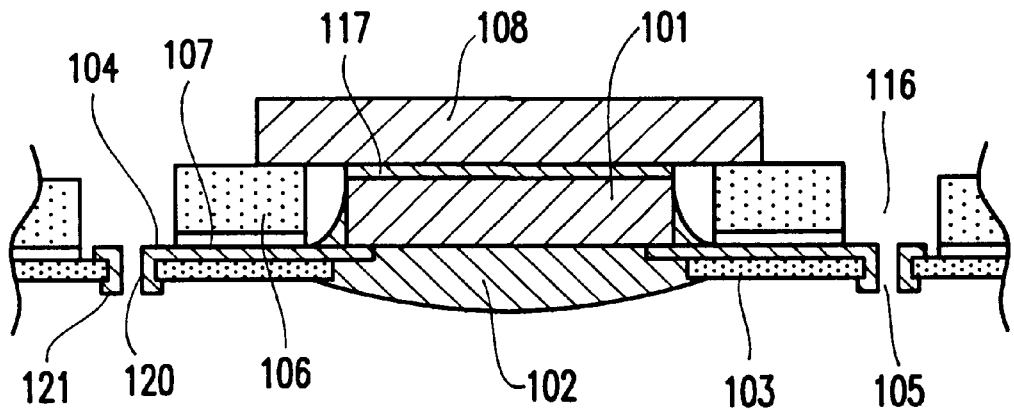
FIG. 10 shows the structure of an electronic device assembly according to a sixth embodiment of the present invention.

Referring to FIG. 10, in the sixth embodiment, the plate 106 is attached to the upper surface of the flexible substrate 103.

In the sixth embodiment, the height of the solder 118 is not limited by the thickness of the plate 106.

Next is described a seventh embodiment of the present invention. The feature of the seventh embodiment is the structure of the plate 106. The other structures and functions are the same as those of the fifth embodiment.

Figure 11:
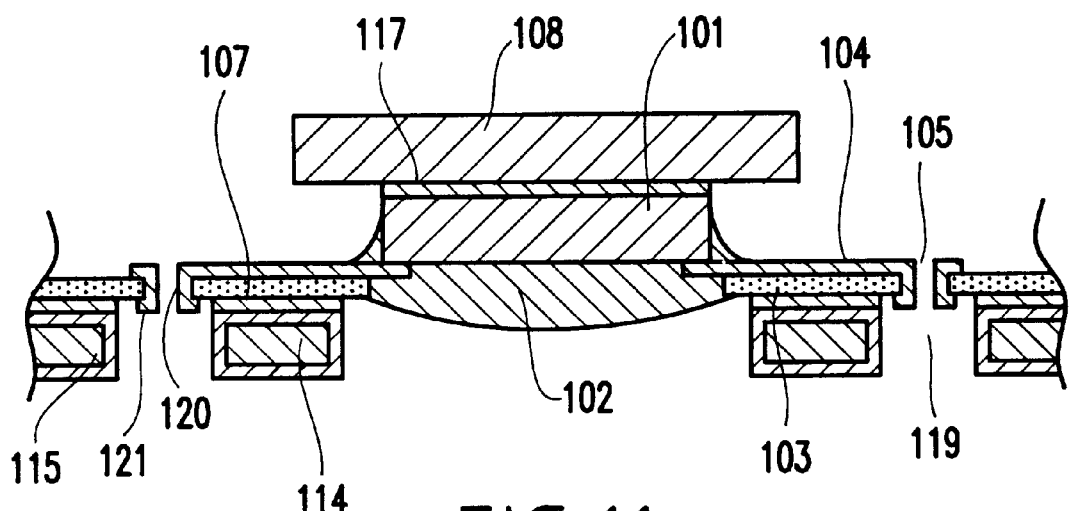
FIG. 11 shows the structure of an electronic device assembly according to a seventh embodiment of the present invention.

Referring to FIG. 11, the plate 106 of the seventh embodiment includes a metal plate 114. The metal plate 114 is coated with an insulating material 115 such as organic insulating materials and/or ceramics.

Next is described an eighth embodiment of the present invention. The feature of the eighth embodiment is the structure of the through-hole 105. The other structures and functions are the same as those of the fifth embodiment.

Figure 12:
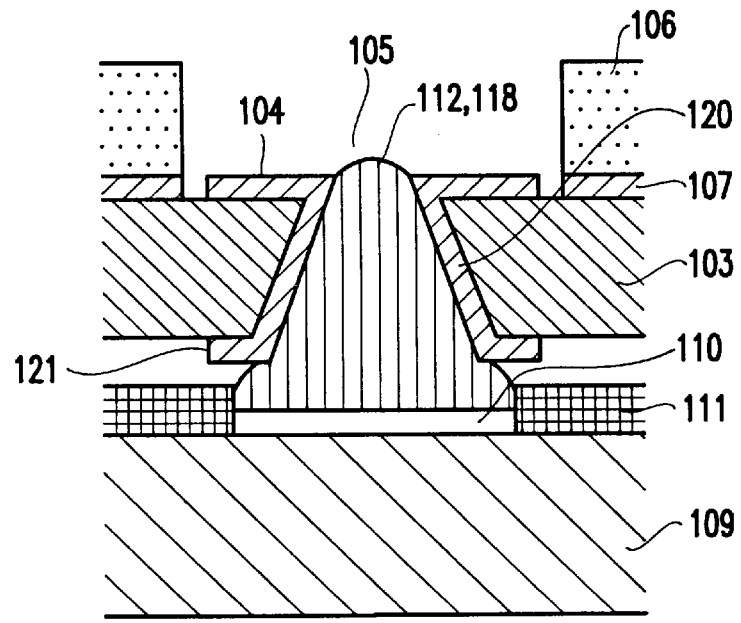
FIG. 12 shows the structure of an electronic device assembly according to a eighth embodiment of the present invention.
Figure 13:
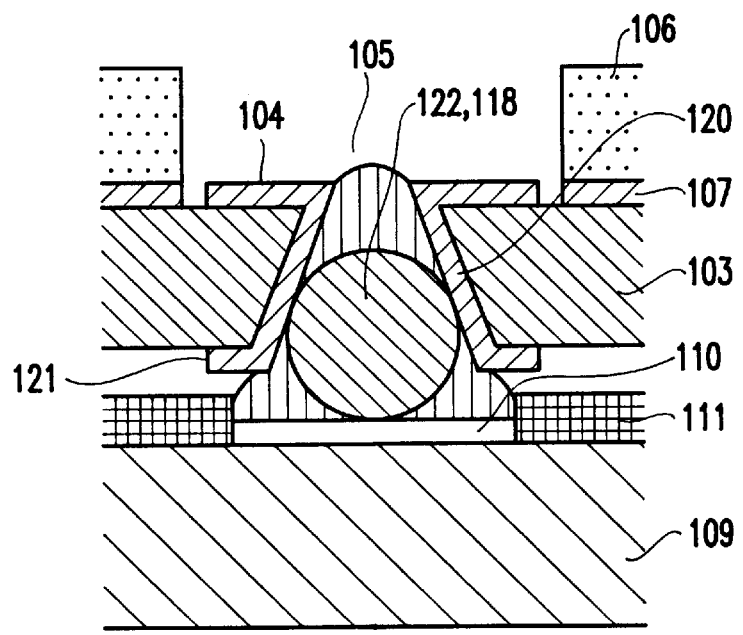
FIG. 13 shows the structure of an electronic device assembly according to a ninth embodiment of the present invention.

Referring to FIG. 12, the through-hole 105 is tapered. Specifically, the diameter of the through-hole 105 is about 200 $\mu$m and 400 $\mu$m at the upper and lower surfaces of the flexible substrate 103, respectively.

Next is described a ninth embodiment of the present invention. The feature of the ninth embodiment is a core 122 provided between the pads 110 and 121. The other structures and functions are the same as those of the third embodiment.

Referring to FIG. 6, a core 122 is provided between the pads 110 and 121. The melting point of the core 122 is higher than that of the solder 118 and the solder paste 112 so that the core 122 does not melt in the heating step shown in FIG. 9(*d*). The core 122 is preferably formed from a metal or a ceramic. The upper portion of the core 122 is received in the through-hole 105. The distance between the pads 110 and 121 can be adjusted precisely due to the core 122 and suitably varying its diameter.

The present embodiments are therefore, to be considered in all respects as illustrative and not restrictive, the scope of the invention being indicated by the appended claims rather than by the foregoing description and all changes which come within the meanings and range of equivalency of the claims are therefore intended to the embraced therein.

What is claimed is:

1. An electronic device assembly, comprising:

a rigid, first substrate having a first surface, a second surface, a first pad on said second surface, and a through-hole at a position of said first pad;

a second substrate having a first surface, a second surface, and a second pad on said first surface thereof, said first surface of said second substrate facing said second surface of said first substrate; and solder connecting said first and second pads, at least a part of said solder being positioned in said through-hole of said first substrate;

said first substrate comprising:

a flexible substrate having a first surface, and a second surface, said through-hole being provided in said flexible substrate, said first pad being provided on said second surface of said flexible substrate; and a rigid plate attached to said flexible substrate, said plate having a hole at a position of said through-hole.

2. An electronic device assembly according to claim 1, wherein said plate is attached to said second surface of said flexible substrate.

3. An electronic device assembly according to claim 1, further comprising an electronic device mounted on said first surface of said first substrate.

* * * * *